Aug. 1, 1961 C. J. NORTON 2,994,839
TRANSISTOR OSCILLATOR
Filed Sept. 19, 1956

INVENTOR.
CLYDE J. NORTON,
BY Perry E. Turner
AGENT

United States Patent Office 2,994,839

Patented Aug. 1, 1961

2,994,839

TRANSISTOR OSCILLATOR

Clyde J. Norton, Sepulveda, Calif., assignor to Lear, Incorporated, Santa Monica, Calif.

Filed Sept. 19, 1956, Ser. No. 610,861
4 Claims. (Cl. 331—113)

Figure 1:
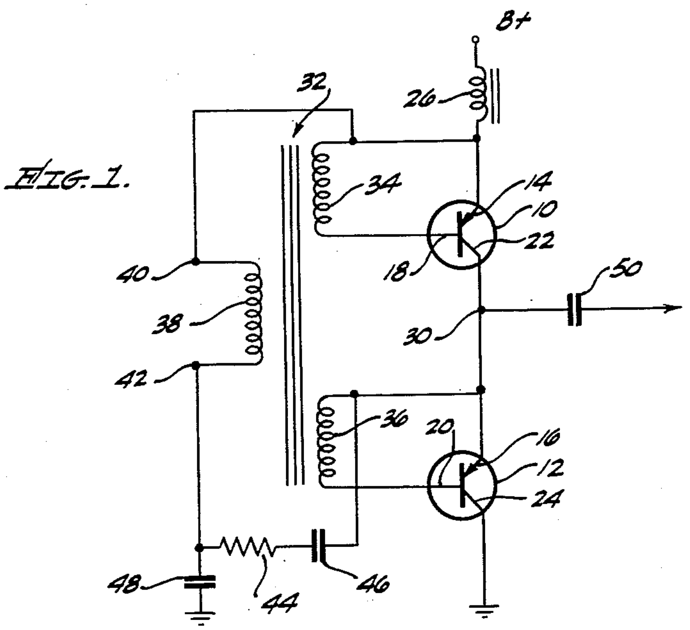

This invention relates to electric signal generators or oscillator circuits, and in particular to such circuits utilizing semi-conductor devices.

The recent development of commercially useful semi-conductor devices such as transistors has had a decided effect upon, and has caused the introduction of many new techniques in, the electric signal and communication field. These devices, which employ a semi-conductor element having three contacting electrodes, are small in size, especially when compared with the ordinary vacuum tube, require no heater power, are very durable, and consist of materials which appear to have a long and useful life. Therefore, the use of transistors for oscillator and other circuits has been the subject of investigation.

As is well known, transistors are of two general classes which are known as the point-contact transistor and the junction transistor. Each of these classes is known to exhibit different characteristics which have made one class preferable to the other for certain circuit applications. However, recent developments indicate that junction transistors are preferred in electric signal and communication systems of all types. It is obvious that the exclusive use of one type of transistor in a receiver, for example, is a decided advantage; repair procedures are simplified when transistors have to be replaced, and various transistor units may normally be made interchangeable. Therefore, it is desirable to provide a junction type transistor oscillator circuit to replace known point-contact transistor oscillators which in various instances are preferred because of their simplicity.

It is, accordingly, an object of this invention to provide an improved oscillator circuit which utilizes semi-conductor devices having a current gain less than unity.

It is another object of this invention to provide an improved signal generator circuit of the type utilizing junction transistors.

It is a further object of this invention to provide a semi-conductor oscillator circuit utilizing transistors of the junction type, which is of extremely simple design, and wherein oscillations are sustained in a highly reliable manner.

These and further objects are achieved by using a pair of junction transistors having their emitter-collector current paths connected in series between two points of D.-C. potential; and with respective secondary windings of a saturable core reactor or transformer connected between the emitter and base of each transistor. The primary winding of such transformer is connected directly at one terminal to one emitter, and its other terminal is coupled to the other emitter. The transistors are rendered alternately conducting automatically, the junction of the collector electrode of one and the emitter electrode of the other transistor being automatically varied between the two points of D.-C. potential.

The above and other objects and advantages of this invention will be apparent from the following description, taken in conjunction with the accompanying drawing, in which a preferred embodiment of the invention is illustrated by way of example. The scope of the invention is pointed out in the appended claims. In the drawing, FIG. 1 is a schematic diagram illustrating an improved junction type transistor oscillator circuit, in accordance with this invention, and FIGS. 2*a* and 2*b* illustrate waveforms to aid in explaining the operation of the oscillator of FIG. 1.

Figure 2A:
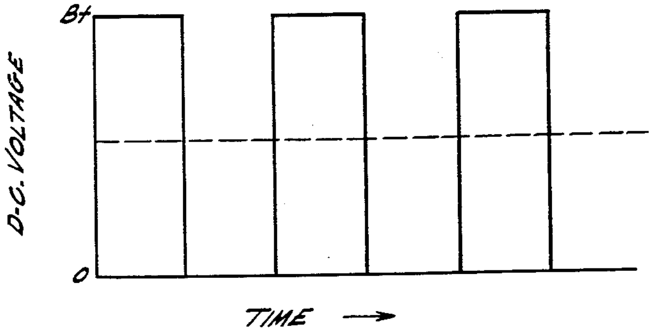
Figure 2B:
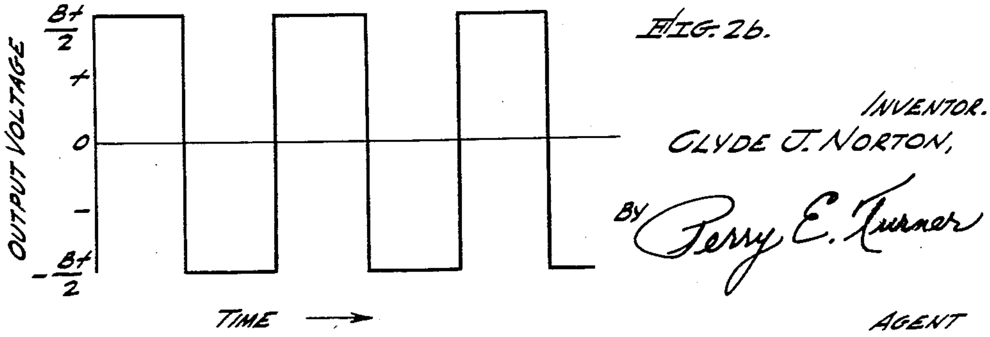

Referring to FIG. 1, the improved oscillator circuit of this invention utilizes a pair of transistors 10, 12 having respective emitter electrodes 14, 16, base electrodes 18, 20, and collector electrodes 22, 24. Transistors 10, 12 are illustrated, by way of example, as being junction transistors of the P-N-P type, although it should be understood that by reversing the potentials, N-P-N type junction transistors could also be used. When using transistors of the P-N-P type, each collector electrode and emitter will be in contact with respective P type zones, and the base electrode will be in contact with the N type zone. Preferably, transistors 10, 12 are of the type commonly known as power transistors.

The emitter electrode 14 of transistor 10 is connected through a choke coil 26 to the positive terminal, B+, of a suitable D.-C. supply source, and the collector electrode 24 of the other transistor 12 is connected to a point of reference or ground potential. The collector electrode 22 of transistor 10 and the emitter electrode 16 of transistor 12 are directly connected and have a common junction 30, as indicated. Thus, the emitter-collector paths of transistors 10, 12 are connected in series between B+ and ground.

A saturable core reactor or transformer 32 is provided with two secondary windings 34, 36. One secondary winding 34 is connected between the base electrode 18 and emitter electrode 14 of transistor 10, and the other secondary winding 36 is connected between the base electrode 20 and emitter electrode 16 of transistor 12. The primary winding 38 of transformer 32 has one terminal 40 connected directly to the emitter electrode 14 of transistor 10 and its other terminal 42 is connected through a resistor 44 and capacitor 46 to the emitter electrode 16 of transitsor 12. A capacitor 48 is connected between terminal 42 of primary winding 38 and ground.

In operation, when the D.-C. supply source is initially turned on to connect emitter electrode 14 and the terminal 40 of primary winding 38 to B+, a condition prevails wherein the emitter electrode 14 of transistor 10 is instantaneously more positive than its base electrode 18. This is the condition of conduction, whereby transistor 10 functions as a closed switch to place junction 30 at B+ potential. By virtue of the characteristics of the saturable core transformer 32, conduction of transistor 10 will be maintained until core saturation occurs. At saturation, the output voltage decreases sharply, and the emitter-base bias on transistor 10 correspondingly changes to bias transistor 10 off. At this point, transistor 12 is biased for conduction, whereupon junction 30 is placed at ground potential. This condition is maintained until core saturation in the reverse direction occurs, where the reverse of the above operation takes place to cause transistor 12 to be cut off and transistor 10 to conduct. In this manner, junction 30 is alternately varied between B+ and ground. The reversals of bias on the transistors occur substantially instantaneously, and the D.-C. voltage variations at junction 30 are correspondingly, rapid, as indicated in FIG. 2*a*. The frequency, of course, is determined by the saturation characteristics of transformer 32, the design principles for which are well known. Thus, a capacitor 50 connected to junction 30 will remove the D.-C. and provide a square wave output voltage (see FIG. 2*b*) of substantially constant amplitude, the magnitudes of the half cycles being equal to half the supply voltage, and which is suitable for use in many applications. For example, the square wave output may be utilized as a reference square wave voltage for use in a phase comparison network, as for detecting the phase of a varying signal relative to such reference voltage and developing a D.-C. output voltage representing such phase relationship. Or it may be utilized as the reference voltage applied to the reference winding of a two-phase motor, the operation of which is controlled by variations in phase of signal voltages applied to its control winding.

Choke 26 provides for suppression of noise which might otherwise be fed from the circuit to the D.-C. supply source. If desired, other or additional noise suppression means well known in the art could be utilized. Capacitor 46 functions to prevent D.-C. voltage from affecting the operation of transformer 32, i.e., it constitutes D.-C. isolation means. Resistor 44 and capacitor 48 provide noise reducing means to control the switching speed of transistors 10, 12 so that high frequency transients and accompanying radio noise do not appear in the circuit to affect the output voltage. It will be apparent that resistor 44 and capacitor 48 illustrate only one way to suppress noise. Many other means suitable for this purpose will readily suggest themselves; therefore, it should be understood that this invention is not limited to the particular arrangement shown.

As described herein, an improved oscillator circuit, in accordance with the invention, employs a pair of junction transistors having their emitter-collector paths connected in series between two points of D.-C. potential, and by means of a saturable core transformer the transistors are automatically made alternately conducting to vary the potential at a point intermediate their respective emitter-collector paths between the two points of D.-C. potential. The invention provides a relatively stable circuit which utilizes a minimum of circuit elements, thus achieving simplicity with reliability.

What is claimed is:

1. An oscillator circuit comprising first and second transistors each having an emitter electrode, a base electrode and a collector electrode, the emitter electrode of said first transistor being connected to a first point of direct current potential, the collector electrode of said second transistor being connected to a second point of direct current potential, the collector electrode of said first transistor and the emitter electrode of said second transistor being directly connected and having a common junction point therebetween, a saturable core transformer including a primary winding having first and second end terminals, said transformer having first and second secondary windings, said first secondary winding being connected between the emitter electrode and base electrode of said first transistor, said second secondary winding being connected between the emitter electrode and base electrode of said second transistor, the first terminal of said primary winding being connected directly to the emitter electrode of said first transistor, and direct current isolation means connected between the emitter electrode of said second transistor and the second terminal of said primary winding.

2. A square wave generator comprising first and second transistors each having an emitter electrode, a base electrode and a collector electrode, a source of direct current voltage of predetermined polarity, the emitter electrode of said first transistor and the collector electrode of said second transistor being directly connected the remaining emitter electrode of one of said transistors being connected to said source and the remaining collector electrode of the other of said transistors being connected to a point of reference potential, a saturable core reactor including a first inductive element connected between the emitter electrode and base electrode of said first transistor, a second inductive element connected between the emitter electrode and base electrode of said second transistor, a third inductive element having first and second terminals, a capacitive connection between one of said emitter electrodes and said first terminal, and a direct connection between the remaining emitter electrode and said second terminal.

3. In an oscillator circuit having a ground connection therein the combination comprising first and second semiconductive devices each having a semi-conductive body and including base, collector and emitter electrodes in contact with said body, said devices being characterized by a current gain of less than unity, means connecting the collector electrode of said first transistor to the ground connection, a direct connection between the emitter electrode of said first transistor and the collector electrode of said second transistor, means connecting the emitter electrode of said second transistor to a point of direct current potential, saturable core transformer connected between the emitter electrodes of said first and second transistors, said saturable core transformer having a primary winding with one terminal connected to the emitter electrode of said second transistor, a capacitive connection between the other terminal of said primary winding and said emitter of said first transistor, said saturable core transformer including first winding coupling the emitter electrode and base electrode of said second transistor and second windings coupling the emitter electrode and base electrode of said first transistor, said saturable core transformer through said primary windings and said first and second windings effecting emitter-to-collector current flow through said transistors alternately, thereby to move the potential at said direct connection between ground and said point of direct current potential, and output means coupled to said direct connection to convert the varying direct-current potentials at said direct connection to an alternating voltage.

4. An oscillator circuit comprising first and second transistors each having an emitter electrode, a base electrode and a collector electrode, the collector electrode of said first transistor and the emitter electrode of said second transistor being directly connected to a common junction point, the collector electrode of said second transistor being connected to ground, means connecting the emitter electrode of said first transistor to a point of direct current potential, a saturable core transformer having a primary winding with one terminal connected to said point of direct current potential and the second terminal connected to ground, said saturable core transformer having first and second secondary windings, said first secondary winding having one terminal connected to said emitter of said first transistor and the other terminal of said first secondary winding connected to said base of said first transistor, and said second secondary winding having one terminal connected to said emitter of said second transistor and the other terminal of said second secondary winding connected to said base of said second transistor, direct current isolation means including a reactive circuit element coupled between said common junction point and said second terminal of said primary winding, said transformer effecting, alternate emitter-to-collector conduction through said transistors to conductively connect said common junction point alternately between said point of direct current potential and ground, and output circuit means connected to said common junction point to develop an alternating voltage in response to the varying direct current potential at said common junction point.

References Cited in the file of this patent

UNITED STATES PATENTS 2,783,384 Bright et al. ------------ Feb. 26, 1957